US006876485B1

(12) United States Patent
Dunphy (10) Patent No.: US 6,876,485 B1
(45) Date of Patent: Apr. 5, 2005

(54) MICROMIRRORS WITH ASYMMETRIC STOPPING MECHANISMS

(75) Inventor: Jim Dunphy, San Jose, CA (US)

(73) Assignee: Reflectivity, INC, Sunnyvale, CA (US)

( * ) Notice: Subject to any disclaimer, the term of this patent is extended or adjusted under 35 U.S.C. 154(b) by 0 days.

(21) Appl. No.: 10/703,678

(22) Filed: Nov. 7, 2003

(51) Int. Cl.$^7$ .......................... G02B 26/00; G02B 26/08
(52) U.S. Cl. .......................... 359/291; 359/290; 359/220
(58) Field of Search .......................... 359/291, 290, 359/220, 221, 222, 223, 224, 225

(56) References Cited

U.S. PATENT DOCUMENTS

| 5,212,582 | A | 5/1993 | Nelson | 359/224 |
| 6,147,790 | A | 11/2000 | Meier et al. | 359/291 |
| 6,381,381 | B1 * | 4/2002 | Takeda et al. | 385/16 |
| 6,396,619 | B1 | 5/2002 | Huibers et al. | 359/291 |
| 6,522,454 | B2 | 2/2003 | Meier et al. | 359/291 |
| 6,552,840 | B2 | 4/2003 | Knipe | 359/291 |
| 2004/0114110 | A1 * | 6/2004 | Shin | 353/31 |

* cited by examiner

Primary Examiner—Timothy Thompson
(74) Attorney, Agent, or Firm—Gregory R. Muir (57) ABSTRACT

A micromirror device comprises a plurality of stopping mechanisms that sequentially stop the mirror plate of the micromirror device when the micromirror device is rotating towards a state, such as an ON or OFF state. The mirror plate sequentially separates from the stopping mechanisms when the mirror plate is rotating towards another state, such as the OFF or ON state.

45 Claims, 5 Drawing Sheets

MICROMIRRORS WITH ASYMMETRIC STOPPING MECHANISMS

TECHNICAL FIELD OF THE INVENTION

The present invention is related generally to the art of microstructures, and, more particularly, to micromirrors with stopping mechanisms.

BACKGROUND OF THE INVENTION

Microstructures, such as microelectromechanical devices, have found many applications in basic signal transduction. For example, a spatial light modulator based on a microelectromechanical device steers light in response to electrical or optical signals. Such a modulator can be a part of a communication device or an information display.

A major factor that limits the reliability and widespread use of microelectromechanical devices is adhesion. Adhesion is a result of the dominance of surface and interfacial forces, such as capillary, chemical bonding, electrostatic, and van der Waals forces, over mechanical forces which tend to separate microelectromechanical components. When mechanical restoring forces cannot overcome adhesive forces, the microelectromechanical devices are said to suffer from stiction. Stiction failures in contacting microstructures, such as micromirror devices, can occur after the first contacting event (often referred to as initial stiction), or as a result of repeated contacting events (often referred to as in-use stiction). Initial stiction is often associated with surface contamination (e.g., residues of bonding materials or photoresist), or with high energy of contacting surfaces (e.g., clean oxidized silicon or metallic surfaces). For the case of in-use stiction, each time one part of the microstructure (e.g. mirror plate of a micromirror device) touches the other (e.g. stopping mechanism) or the substrate, the contact force grows and ultimately becomes too large for the restoring force to overcome. In this case, the device remains in one state indefinitely.

Therefore, a micromirror device that tolerates surface forces without causing in-use stiction failure is desired.

SUMMARY OF THE INVENTION

In view of the foregoing, the present invention discloses a micromirror device having multiple stopping mechanisms of different configurations. The stopping mechanisms sequentially stop the rotation of the mirror plate of the micromirror device at a desired angle when the mirror plate rotates towards a state (e.g. ON or OFF state) in response to an electrostatic field between the mirror plate and an electrode. When the electrostatic field is removed, the mirror plate separates from the stopping mechanisms sequentially. The present invention is of particular importance in reducing the in-use stiction due to surface forces between the mirror plate and the stopping mechanisms. Because the stopping mechanisms of the present invention enable the mirror plate to sequentially separate from the stopping mechanisms in contact, the micromirror of the present invention can tolerate larger in-use stiction (or surface force) compared to a micromirror wherein the mirror plate separates from the stopping mechanisms simultaneously.

In an embodiment of the invention, a method for operating a micromirror having a mirror plate attached to a hinge such that the mirror plate is operable to rotate, the method comprising: rotating the mirror plate in a first rotation direction; stopping the rotation of the mirror plate in the first direction by a first stopping mechanism; rotating the mirror plate in a second rotation direction other than the first rotation direction; and stopping the rotation of the mirror plate in the second direction by a second stopping mechanism other than the first stopping mechanism.

In another embodiment of the invention, a micromirror device is disclosed. The device comprises: a substrate; a mirror plate attached to a hinge on the substrate such that the mirror plate is operable to rotate relative to the substrate; a first stopper that contacts the mirror plate when the mirror plate is rotated in a first rotation direction; and a second stopper that contacts the mirror plate when the mirror plate is rotated in a second rotation direction other than the first rotation direction.

In yet another embodiment of the invention, a micromirror device is disclosed. The device comprises: a substrate; a mirror plate attached to a hinge on the substrate such that the mirror plate is operable to rotate relative to the substrate; and a plurality of stopping mechanisms, at least one of which extends further than the other stopping mechanism.

In yet another embodiment of the invention, a method for operating a micromirror having a mirror plate attached to a hinge on a substrate such that the mirror plate can rotate relative to the substrate is disclosed. The method comprises: rotating the mirror plate relative to the substrate; and stopping the rotation of the mirror plate by at least two stoppers, wherein the plate is stopped by one stopper earlier than the other.

In yet another embodiment of the invention, a projector is provided. The projector comprises: a light source; a condensing lens for focusing light from the light source; a spatial light modulator having an array of micromirrors for reflecting light from the light source, each micromirror further comprising: a substrate; a mirror plate attached to a hinge on the substrate such that the mirror plate is operable to rotate relative to the substrate; and a plurality of stopping mechanisms, at least one of which has a length that is shorter than the other stopping mechanisms; and a display target.

In yet another embodiment of the invention, a projector is provided. The projector comprises: a light source; a condensing lens for focusing light from the light source; a spatial light modulator having an array of micromirrors for reflecting light from the light source, each micromirror further comprising: a substrate; a mirror plate attached to a hinge on the substrate such that the mirror plate is operable to rotate relative to the substrate; a first stopper that contacts the mirror plate when the mirror plate is rotated in a first rotation direction; and a second stopper that contacts the mirror plate when the mirror plate is rotated in a second rotation direction other than the first rotation direction; and a display target.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

Figure 1:
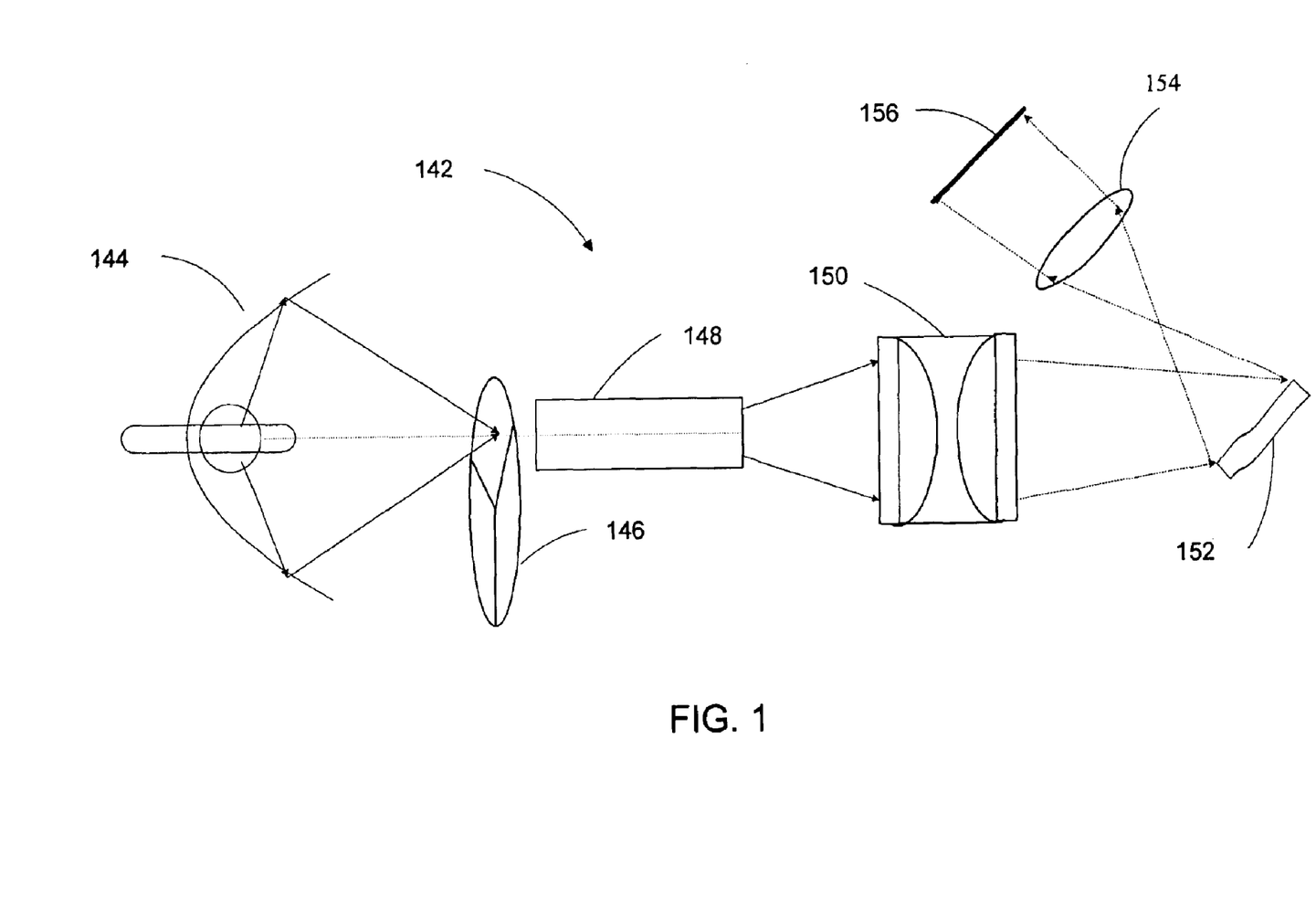
FIG. 1 is an exemplary display system in which embodiment of the invention can be implemented.

Turning now to the drawings, FIG. 1 illustrates a simplified display system in which embodiments of the invention can be implemented. In its basic configuration, display system 142 comprises light source 144, color filter 146, optical elements (e.g. light pipe 148, collection lens 150 and projection lens 154), display target 156 and spatial light modulator 152 that often comprises an array of thousands or millions of micromirrors that are individually addressable.

In operation, light from the light source (e.g. an arc lamp) travels through the color filter, light pipe and collection lens and shines on the micromirrors of the spatial light modulator. The micromirrors individually reflect the incident light from the light source either onto (when in their "ON" position) or away from (when in their "OFF" state) the projection lens, resulting in an image on display target 210.

Figure 2:
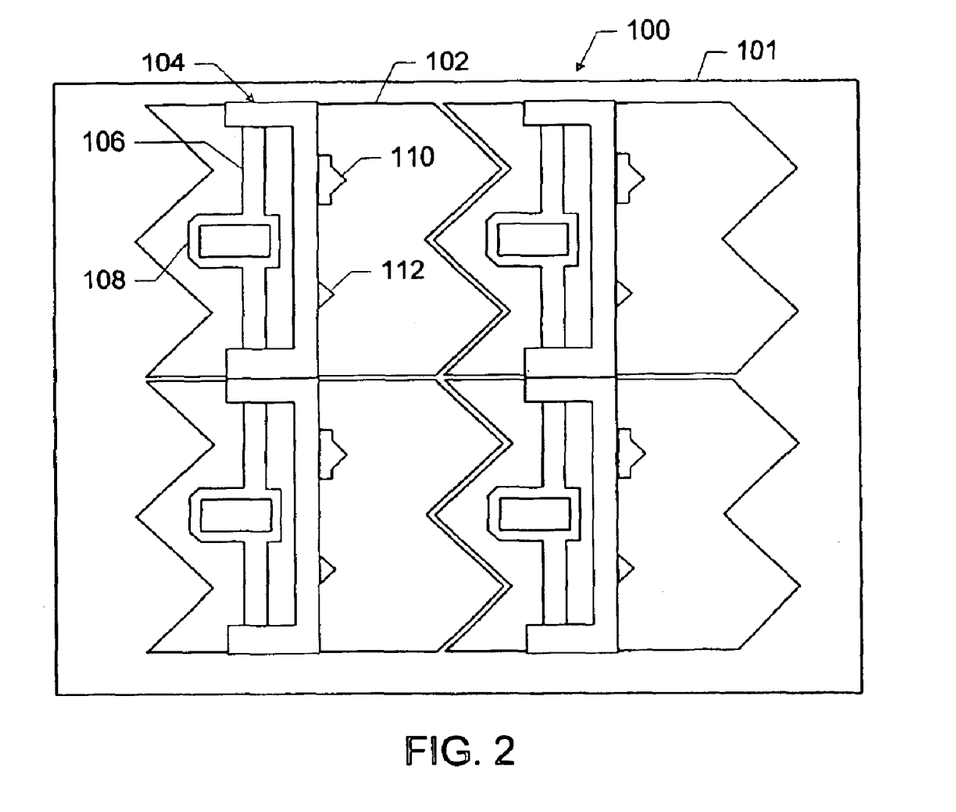
FIG. 2 is a bottom-view portion of an exemplary micromirror array of the spatial light modulator in FIG. 1.

Referring to FIG. 2, a bottom-view of a portion of an exemplary micromirror array of the spatial light modulator in FIG. 1 is illustrated therein. The micromirror array is formed on glass substrate 101 that is transmissive to visible light. Alternatively, substrate 101 can be a semiconductor wafer having electrodes and circuitry formed therein. Each micromirror comprises a reflective micromirror plate, such as micromirror plate 102 for reflecting the incident light. The mirror plate is attached to a hinge (e.g. hinge 104) formed on the substrate such that the mirror plate can rotate relative to the substrate. The hinge may take any suitable forms. In this particular example, the hinge is part of a hinge structure (e.g. hinge structure 104) that further comprises hinge support 107. The hinge support connects the substrate via posts (not shown) and holds the hinge (e.g. hinge 106) on the substrate. The mirror plate is attached to the hinge at an attachment point that is not at the center of the mirror plate such that the mirror plate rotates symmetrically along a rotation axis. Specifically, the mirror plate can rotates to a larger maximum angle in one direction as compared to the maximum angle that the mirror plate can rotate in the opposite direction. In other embodiments of the invention, the attachment point of the mirror plate to the hinge is at the center of the mirror plate and the mirror plate can rotate symmetrically along the rotation axis. In fact, the mirror plate can be attached to the hinge in any suitable way, as long as the mirror plate can rotate or otherwise deflect relative to the substrate.

In operation, the mirror plate rotates between the ON and OFF states for reflecting the incident light from the light source either onto or away from the projection lens so as to produce desired image on the display target. The quality of the displayed image strongly depends upon the ON and OFF state of all micromirrors. In order to define a uniform ON state for all micromirrors of the micromirror array, multiple stopping mechanisms, such as stoppers 110 and 112 are provided for each micromirror. According to the invention, the stoppers of the micromirror device have different geometrical configurations. The stoppers sequentially stop the mirror plate at certain angles when the mirror plate rotates towards a state (e.g. ON or OFF state). Specifically, the mirror plate experiences an intermediate state before it reaches the final ON or OFF state. At the final state, the stoppers contact the mirror plate. When the mirror plate separates from the stoppers, the mirror plate separates from the stoppers sequentially, that is the mirror plate also experiences an intermediate state before it separates from all the stoppers.

Figure 3:
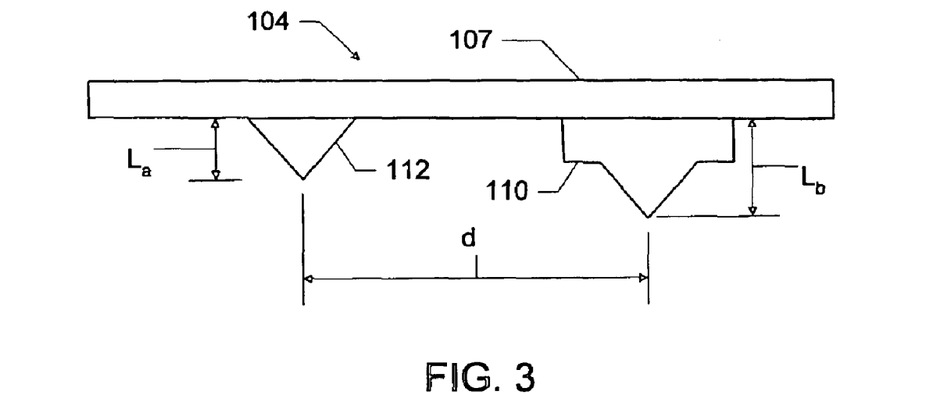
FIG. 3 is a portion of a side-view of the hinge and stoppers of a micromirror device of the micromirror array in FIG. 2.

Referring to FIG. 3, the stoppers are formed on an edge of hinge support 107 in this particular example. The stoppers have different geometries. Specifically, stopper 110 has a longer length $L_b$ measured from the edge of the hinge support than the length $L_a$ of stopper 112. The lengths $L_a$ and $L_b$ are determined according to the desired ON state angle of the micromirrors. In the embodiment of the invention, the ON state angle is from 10° to 18° degrees relative to the substrate. The difference between the lengths of the stoppers is determined based upon many factors, such as the spring constant of the hinge and the stiction between the stopper and the mirror plate when they are in contact. In an embodiment of the invention, the difference between the lengths of the stoppers is from 0.1 to 2 micrometers. In one embodiment of the invention, the contacting point of one stopper is 1% or more, or 5% or more further than the other contacting point, relative to the point of the attachment if the hinge to the mirror plate. The stoppers can be arranged symmetrically on the opposite sides of the hinge support (107) center. Alternatively, the stoppers can be formed at any desired locations. For example, the two stoppers can be disposed on the same side of the hinge support center. Or they can be disposed asymmetrically on the opposite sides of the hinge support center. In other embodiments of the invention, more than two stoppers are provided for a micromirror, wherein at least on stopper is different in length from the other stoppers. For example, three stoppers can be formed on the hinge support. The stopper has the maximum length measured from the hinge is disposed at the center of the hinge support, and the other two stoppers are disposed on each side of the hinge support. In this case, the mirror plate is stopped by the stopper at the hinge support center and then stopped by one of the other two stoppers. Other number of stoppers and other type of arrangements of the stoppers are also applicable, as along as at the stoppers sequentially stop the mirror plate at certain angles when the mirror plate rotates towards a state (e.g. the ON or OFF state).

Figure 4:
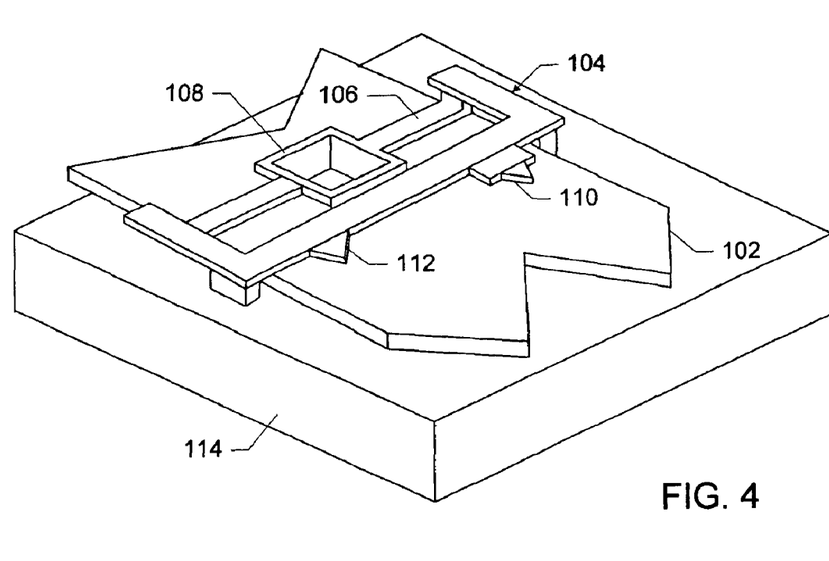
FIG. 4 is a perspective view of a portion of the micrometer device in FIG. 2.

Referring to FIG. 4, a perspective view of a portion of a micrometer device of FIG. 2 is illustrated therein. The mirror plate is attached to the hinge and can rotate relative to the substrate. The OFF state is defined as the natural resting state (e.g. in parallel to the substrate) and the ON state is defined by the stoppers 110 and 112, as shown in FIG. 5.

Figure 5:
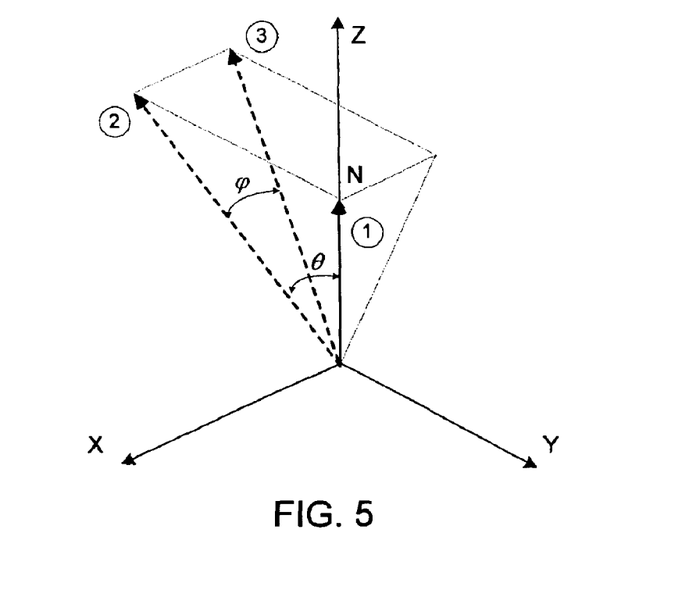
FIG. 5 illustrates rotation positions of the mirror plate in a Cartesian reference.

Referring to FIG. 5, the rotation position of the mirror plate is represented by normal vector N of the mirror plate. In the OFF state (also the natural resting state), the mirror plate is parallel to the substrate. Accordingly, the normal vector N is pointing the positive Z axis of the Cartesian reference XYZ, as denoted by position 1. In response to an electrostatic field between the mirror plate and an electrode (not shown in FIG. 4), the mirror plate rotates towards the ON state. In the Cartesian reference, the normal vector N rotates in X-Y plane. When the mirror plate rotate to a desired angle θ (e.g. an angle of from 10° to 18° degrees relative to the substrate), the mirror plate is stopped by stopper 110 that has a longer length in FIG. 4, that is, the mirror plate contacts against stopper 110. The position of the normal vector N is illustrated at position 2. At this very moment, the mirror plate is not in contact with stopper 112 and has a shorter length, and the mirror plate is still free to rotate along Y axis. Consequently, the mirror plate continuously rotates clockwise along Y axis. Accordingly, the normal vector N rotates in X-Z plane clockwise along Y axis from position 2. When the mirror plate rotates to a desired angle φ from the position is stopped by stopper 110, the mirror plate is stopped by stopper 112. The mirror plate is not free to move in response to the electrostatic field. The normal vector N of the mirror plate is at position 3 as shown in the figure. In the embodiment of the invention, angle φ is from 0.1° to 5° degrees.

During the course of rotation from position 1 to position 2, the hinge (e.g. hinge 106) is deformed along the length and a first type of deformation is accumulated along the length of the hinge. During the course of rotation from the position 2 to position 3, the hinge is deformed along the width and a second type of deformation is accumulated along the width of the hinge.

When a rotation of the mirror plate from the ON state to the OFF state (e.g. to its natural resting state) is desired, the electrostatic field is removed. The mirror plate separates from the stoppers sequentially. Specifically, upon removal of the electrostatic field, the mirror plate separates from stopper 112 in response to a torque that corresponds to the first and second types of deformation along the length and width of the hinge until such deformation is fully released. As a simplified approximation, the torque equals the summation of half of the first type of deformation and the second type of deformation when the two stoppers are symmetrically disposed on the opposite sides of the hinge support center along the hinge support. Consequently, the mirror plate rotates through angle φ. In the Cartesian reference, the normal vector N of the mirror plate rotates counterclockwise in the X-Z plane along Y axis from position 3 to position 2. At the position 2, the mirror plate is separate from stopper 112. In response to another torque that corresponds to the first type of deformation along the length of the hinge, the mirror plate separates from stopper 110 and rotates along X axis until such deformation is fully released. As a simplified approximation, the other torque equals the half of the first type of deformation minus the second type of deformation when the two stoppers are symmetrically disposed on the opposite sides of the hinge support center along the hinge support. The mirror plate returns to its natural resting state (the OFF state). Accordingly, the normal vector of the mirror plate rotates from position 2 to position 1 in Y-Z plane along X axis. Moreover, as the mirror plate departs from stopper 112, the mirror plate gains certain amount of momentum. This momentum in turn helps the departure of the mirror plate from stopper 110.

The multiple stopping mechanisms of different configurations enable the mirror plate to be stopped sequentially and separate from the stoppers sequentially. Specifically, the mirror plate is stopped by one stopper earlier than another stopper. And the mirror plate separates from one stopper also earlier than from another stopper. This is of particular importance in reducing in-operation stiction of the mirror plate due to surface forces between the mirror plate and the stoppers when they are in contact. As a comparison, considering two micromirrors with the first micromirror as shown in FIG. 4 and the second micromirror being the same as the first micromirror except that the two stopper are the same (e.g. having the same length), the micromirrors are both at the ON state. That is, the mirror plate of the first micromirror is in contacts with the two unequal stoppers and has an angle θ to the substrate and angle φ to Y-Z plane in FIG. 5, wherein the mirror plate of the second micromirror is in contact with the two equal length stoppers and has an angle θ to the substrate but no angle φ to Y-Z plane in FIG. 5. In order to separates from the two stoppers, the mirror plate of the second micromirror needs to overcome the surface forces F between each stopper and the mirror plate simultaneously by the torque τ along the length of the hinge. That is, it required that τ≧2·F·s at time t, wherein s is the distance measured from the axis of rotation to the point where the force is applied. However, the mirror plate of the second micromirror separates the stoppers sequentially. At time $t_1$, torque $τ_1$, as well as torque $τ_2$, drives the mirror plate to separate from the stopper of the shorter length (e.g. stopper 112), wherein torque $τ_1$ is along the width of the hinge and torque $τ_2$ (equal to τ) is along the length of the hinge. When the mirror plate is separated from the stopper of the shorter length and torque $τ_1$ is fully relaxed, torque $τ_2$ (equal to torque τ) drives the mirror plate to separate from the stopper of the longer length (e.g. stopper 110). As a result, the mirror plate only needs to overcome the surface force between the mirror plate and one stopper. That is, the mirror plate can tolerate a larger surface force F' (e.g. F'=2·F) between the mirror plate and one stopper. Therefore, the in-use stiction is reduced.

Figure 6:
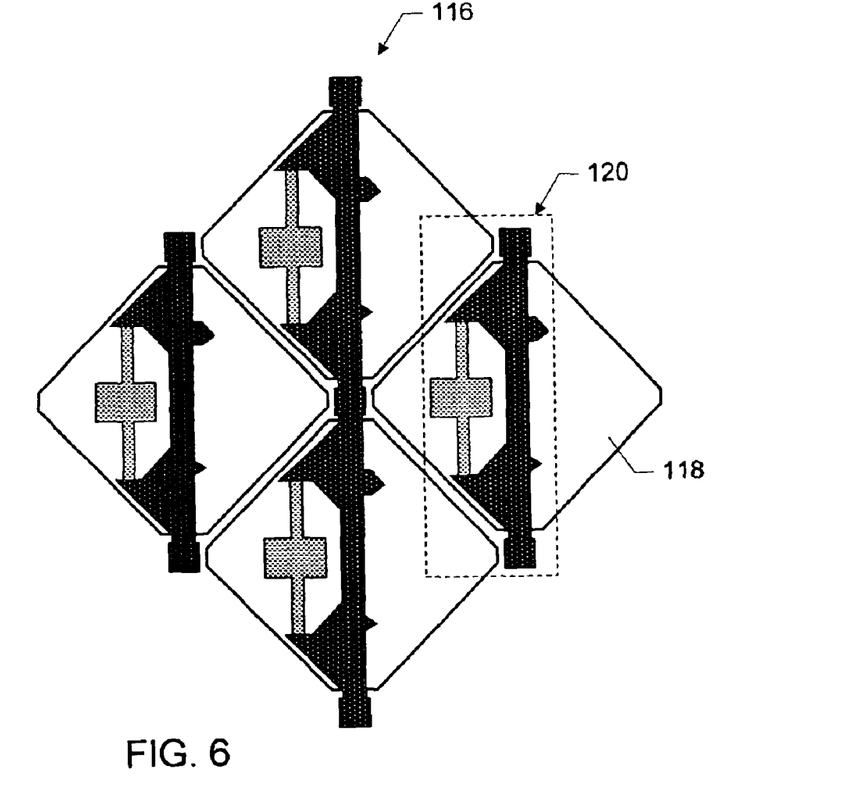
FIG. 6 is a bottom-view of a portion of another exemplary micromirror array having micromirror devices according to an embodiment of the invention.
Figure 7:
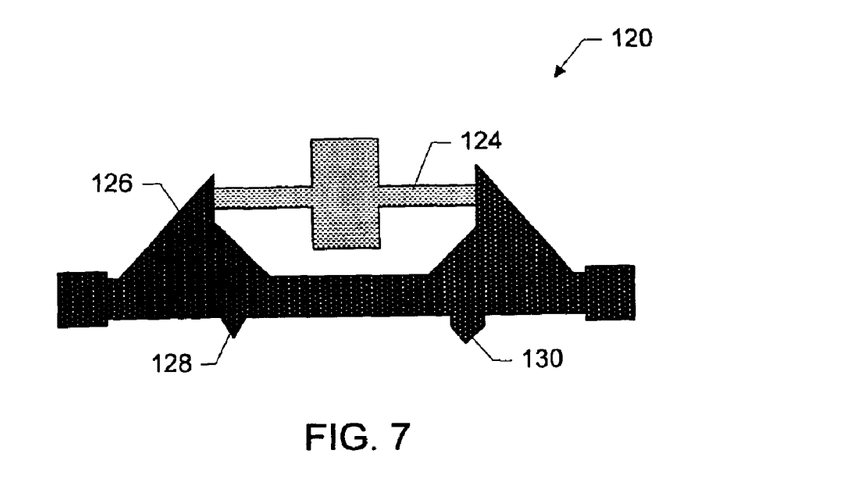
FIG. 7 is an exploded view of the hinge and stoppers of the micromirror device in FIG. 6.

The stoppers and the stopping mechanism of the present invention can be implemented in a variety of micromirror devices as long as the stoppers stop the rotation of the mirror plate sequentially. FIG. 6 illustrates a back-view of a portion of another exemplary micromirror array with each micromirror having a plurality of stoppers of different configurations. Referring to FIG. 6, the mirror plate (e.g. mirror plate 118) has four predominant sides. The mirror plate is attached to the hinge such that the mirror plate can rotate relative to the substrate. FIG. 7 presents the hinge structure of the micromirror in FIG. 6. The hinge structure comprises hinge 124 to which the mirror plate is attached and hinge support 126. Two stoppers 128 and 130 of different lengths from the edge of the hinge support are provided. The two stoppers sequentially stop the mirror plate when the mirror plate rotates to the ON state and at certain angles. When the mirror plate rotates from the ON state to the OFF state, the mirror plate separates one stopper earlier than from the other. As a result, the mirror plate sequentially overcomes one surface force between one stopper and the mirror plate and the other between the other stopper and the mirror plate. That is, the mirror plate of the micromirror can tolerate a larger surface force without device failure due to stiction than the micromirror having stoppers of equal length.

Figure 8:
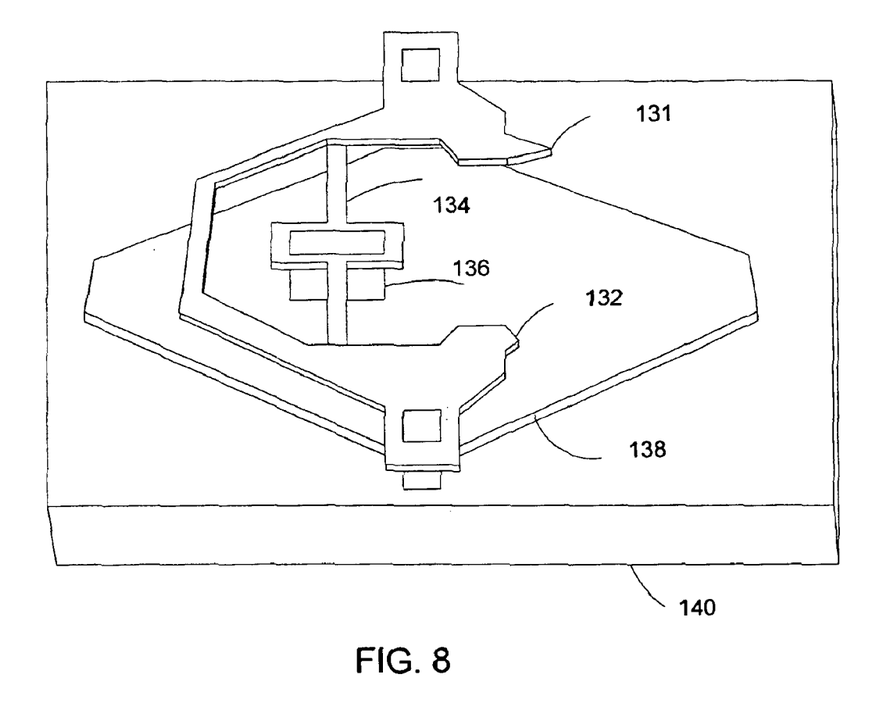
FIG. 8 is a perspective view of a portion of a micromirror device having unequal stoppers according to another embodiment of the invention.

Referring to FIG. 8, a perspective view of another exemplary micromirror device having multiple stopping mechanisms of different lengths is illustrated therein. Mirror plate 138 is attached to hinge 134 via hinge via 136. The mirror plate and the hinge are constructed on substrate 140 which is visible light transmissive glass. Stoppers 131 and 132 are formed on each side of the hinge for stopping the mirror plate when the mirror plate rotates to desired angles. Stopper 131 has a larger length measured from the hinge than stopper 132.

Figure 9:
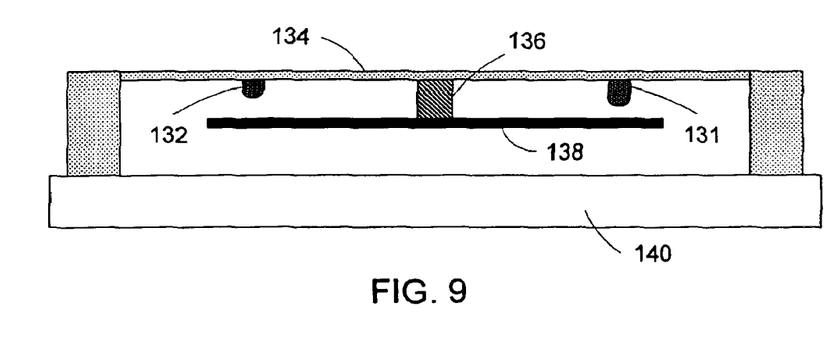
FIG. 9 is a side-view of a portion of a micromirror device having multiple stoppers according to yet another embodiment of the invention.

Rather than forming the stopping mechanisms in the same plane as the hinge, such as those illustrated in FIGS. 2 through 8, the stoppers can be formed on different planes as the hinge. For example, the stopper can be formed on the hinge but extending out from the hinge plane. FIG. 9 illustrates a side view of a micromirror device having two stoppers formed on the hinge but on different planes as the hinge.

Referring to FIG. 9, hinge 134 is formed on substrate 140. Mirror plate 138 is attached to the hinge via hinge via 136 such that the mirror plate can rotate relative to the substrate. Stoppers 132 and 131 are formed on the hinge but on different planes as the hinge. The stoppers have different configurations, such as different lengths from the hinge. In operation, the mirror plate is stopped by stopper 131 earlier than the stopper 132. The mirror plate separates from one stopper also earlier than the other.

In the above, the invention is discussed with reference to embodiments in which the stoppers are formed proximate to hinges of the micromirror devices. This is not an absolute requirement. Instead, the stoppers of different configurations (e.g. lengths) can be formed on any suitable locations of the micromirror device as long as they limit the rotation of the mirror plate and limit rotation of the mirror plate sequentially. For example, the stoppers can be formed on the hinge via 136 of FIG. 9, or on the mirror plate or other deflectable structures.

The hinges as shown in FIGS. 2 through 8 are arranged in the micromirrors such that the hinge is parallel to but offset from a diagonal of the mirror plate when viewed from the top. The offset feature benefits a large ON state angle for the micromirror, which in turn improves the contrast ratio of the image. Though preferred, the offset arrangement of hinge to the mirror plate is not an absolute requirement. Other type of arrangements without offsetting the hinge to the mirror plate is also applicable.

The hinges as shown in these figures (FIGS. 2 through 8) are formed on the opposite side of the mirror plate to the substrate. In other embodiments of the invention, the hinge can be formed on the same side of the mirror plate as the substrate. And the substrate can be any desired substrate such as glass that is transmissive to visible light and a semiconductor wafer on which electrodes and circuitry can be formed.

The stoppers of the present invention may comprise a variety of materials. Specifically, the material of the stoppers may be selected from a group comprising: elemental metal, metalloid, metal alloy, intermetallic compound and ceramic. The elemental metal is preferably a late transition metal and selected from a group comprising Al, Au, Cu, Pt, Co, Ir and Nb. The metal alloy comprises two or more elemental metals that are preferably later transition metals. Exemplary metal alloys for the structural layers are $AlSc_x$ and $CuBe_x$. Exemplary intermetallic compounds are $Ti_xAl_y$, $Ni_xAl_y$ and $Ti_x$-$Ni_y$. It is preferred that the intermetallic compound comprises a late transition metal.

The ceramic is a compound of a metal and a non-metal. The ceramic for the structural layers of the present invention is preferably selected from a group comprising: metalloid nitride (e.g. $SiN_2$), metalloid oxide (e.g. $SiO_2$), metalloid carbide (e.g. $SiC_x$), metalloid oxy-nitride (e.g. $SiO_xN_y$), metal (and preferably transition metal) nitride (e.g. $AlN_x$, $TiN_x$ and $CrN_x$), metal (and preferably transition metal) oxide (e.g. $AlO_x$, $TiO_x$, $TaO_x$ and $CrO_x$), metal (and preferably transition metal) carbide (e.g. $TiC_x$, $TaC_x$ and $CrC_x$), metal (and preferably transition metal) oxy-nitride (e.g. $TiO_xN_y$, $TaO_xN_y$ and $CrO_xN_y$), metal (and preferably transition metal) silicon-nitride (e.g. $TiSi_xN_y$, $TaSi_xN_y$ and $CrSi_xN_y$), and metal (and preferably transition metal) silicon-oxy-nitride. (e.g. $TiSi_xO_yN_2$, $TaSi_xO_yN_z$ and $CrSi_xO_yN_z$). The deformable element may also be composed of polycrystalline or amorphous or nanostructure materials.

It will be appreciated by those of skill in the art that a new and useful a micromirror device having asymmetric stopping mechanisms has been described herein. In view of many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

I claim:

1. A micromirror comprising:
    a mirror plate held on a substrate such that the mirror plate is operable to rotate above the substrate; and
    a first stopper constructed so as to stop the rotation of the mirror plate when rotating from a first position to a second position, wherein the second position is at an angle relative to the substrate and is different from the first position; and
    a second stopper constructed so as to stop the rotation of the mirror plate when rotating from the second position to a third position, wherein the third position is at an angle relative to the substrate and is different from the second position.

2. The micromirror of claim 1, further comprising: a hinge on a substrate, wherein the hinge is attached to the mirror plate and deformed with the rotation of the mirror plate.

3. The micromirror of claim 1, wherein the plurality of stoppers has a first and second stopper, the first stopper stopping the mirror plate earlier than the second stopper.

4. The micromirror of claim 3, wherein the stoppers stop the mirror plate when the mirror plate rotates towards an ON angle.

5. The micromirror of claim 4, wherein the ON state angle is from 10° to 18° degrees.

6. The micromirror of claim 3, wherein the mirror plate departs from the second stopper earlier than the first when the mirror plate rotates towards an OFF state angle.

7. A method for operating a micromirror having a mirror plate held on a substrate, comprising:
    moving the mirror plate from a first position to a second position abutting a first stopper, wherein the second position is at an angle relative to the substrate that is different from the first position; and
    moving the mirror plate from the second position to a third position further abutting a second stopper and wherein the third position is at an angle relative to the substrate different from the first and second positions.

8. The method of claim 7, wherein the mirror plate is stopped by the first stopper earlier than by the second stopper.

9. The method of claim 8, further comprising: departing the mirror plate from the second stopper earlier than the first stopper when the mirror plate is rotating towards another state.

10. A micromirror device, comprising:
    a substrate;
    a mirror plate attached to a hinge on the substrate such that the mirror plate is operable to rotate relative to the substrate;
    a first stopper that contacts the mirror plate when the mirror plate is rotated towards a first state but not in the first state; and a second stopper that contacts the mirror plate when the mirror plate is at the first state.

11. The device of claim 10, wherein the stopping mechanisms and the hinge are on the same plane.

12. The device of claim 10, wherein the stopping mechanisms and the hinge are on different planes.

13. The device of claim 10, wherein the stopping mechanisms extend out of the plane of the hinge.

14. The device of claim 10, wherein the first stopper is longer than the second stopper.

15. The device of claim 10, wherein the substrate is glass that is transmissive to visible light.

16. The device of claim 10, wherein the substrate is a semiconductor substrate having an electrode and circuitry formed thereon.

17. The method of claim 10, wherein the first and second stopping mechanisms comprises a material of the hinge.

18. The device of claim 10, wherein the hinge comprises a conducting layer.

19. The device of claim 10, wherein the hinge comprises an insulating layer.

20. The device of claim 10, wherein the mirror plate comprises a conducting layer.

21. The device of claim 10, wherein the mirror plate comprises an insulating layer.

22. A micromirror device, comprising:

a substrate;

a mirror plate attached to a hinge on the substrate such that the mirror plate is operable to rotate relative to the substrate; and a plurality of stopping mechanisms, at least one of which extends further than the other stopping mechanism such that a rotation of the mirror plate towards a state is stopped sequentially by the plurality of stopping mechanisms.

23. The device of claim 22, wherein the stopping mechanisms and the hinge are on the same plane.

24. The device of claim 22, wherein the stopping mechanisms and the hinge are on different planes.

25. The device of claim 22, wherein the stopping mechanisms extend out of the plane of the hinge.

26. The device of claim 22, wherein the substrate is glass that is transmissive to visible light.

27. The device of claim 22, wherein the substrate is a semiconductor substrate having an electrode and circuitry formed thereon.

28. The method of claim 22, wherein a stopping mechanism of the plurality of stopping mechanisms comprises a material of the hinge.

29. The device of claim 22, wherein the hinge comprises a conducting layer.

30. The device of claim 22, wherein the hinge comprises an insulating layer.

31. The device of claim 22, wherein the mirror plate comprises a conducting layer.

32. The device of claim 22, wherein the mirror plate comprises an insulating layer.

33. A method for operating a micromirror having a mirror plate attached to a hinge on a substrate such that the mirror plate can rotate relative to the substrate, the method comprising:

rotating the mirror plate relative to the substrate; and stopping the rotation of the mirror plate by at least two stoppers, wherein the plate is stopped by one of the two stoppers earlier than the other.

34. The method of claim 33, wherein the mirror plate contacts the two stoppers when it is stopped thereby.

35. The method of claim 33, further comprising:

separating the mirror plate from the stoppers, wherein the mirror plate is separated from one stopper earlier than the other.

36. A micromirror device, comprising:

a substrate;

a mirror plate attached to a hinge on the substrate such that the mirror plate is operable to rotate relative to the substrate; and a plurality of stopping mechanisms disposed for stopping the rotation of the mirror plate, wherein at least one of the plurality of stopping mechanisms is longer than the other such that a rotation of the mirror plate to a state is rotated toward and sequentially stopped by each of the stopping mechanisms.

37. The device of claim 36, wherein the stopper mechanisms and the hinge are on the same plane.

38. The device of claim 36, wherein the stopping mechanisms and the hinge are on different planes.

39. A spatial light modulator for use in a display system, comprising:

an array of micromirrors, each micromirror further comprising: a mirror plate held on a substrate; and a plurality of stoppers that sequentially stop a rotation of the mirror plate to a state such that the mirror plate changes angle when it is stopped by a first stopper of the plurality of stoppers and changes angle when it is stopped by a second stopper of the plurality of stoppers; and wherein the stoppers and the hinge are on different planes.

40. The spatial light modulator of claim 39, wherein the micromirror further comprises: a hinge on a substrate, wherein the hinge is attached to the mirror plate and deformed with the rotation of the mirror plate.

41. The spatial light modulator of claim 39, wherein the plurality of stoppers has a first and second stopper, the first stopper stopping the mirror plate earlier than the second stopper.

42. The spatial light modulator of claim 41, wherein the stoppers stop the mirror plate when the mirror plate rotates towards an ON state angle.

43. The spatial light modulator of claim 42, wherein the ON state angle is from 10° to 18° degrees.

44. The spatial light modulator of claim 41, wherein the mirror plate departs from the second stopper earlier than the first when the mirror plate rotates towards an OFF state angle.

45. The spatial light modulator of claim 39, wherein the stoppers and the hinge are on the same plane.

* * * * *